(12) United States Patent
Ohsawa

(10) Patent No.: US 7,023,752 B2
(45) Date of Patent: Apr. 4, 2006

(54) SEMICONDUCTOR STORAGE APPARATUS

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/092,922

(22) Filed: Mar. 30, 2005

(65) Prior Publication Data
US 2006/0044890 A1   Mar. 2, 2006

(30) Foreign Application Priority Data
Aug. 31, 2004  (JP) .............................. 2004-253059

(51) Int. Cl.
*G11C 7/00*  (2006.01)
(52) U.S. Cl. ...................... 365/205; 365/233
(58) Field of Classification Search ................ 365/205, 365/207, 233, 230.06, 230.08, 189.01, 189.05, 365/194
See application file for complete search history.

(56) References Cited

U.S. PATENT DOCUMENTS 5,241,510 A * 8/1993 Kobayashi et al. .... 365/230.03
5,262,982 A * 11/1993 Brassington et al. ....... 365/145
6,621,725 B1   9/2003 Ohsawa
6,912,150 B1 * 6/2005 Portman et al. ............ 365/149

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A semiconductor storage apparatus according to one embodiment of the present invention, comprising: a cell array including a plurality of memory cells, each being connected to bit lines and word lines arranged in a row direction and a column direction; and a sense amplifier which controls read-out of data stored in the memory cells, wherein the sense amplifier includes: a pair of sense nodes provided corresponding to a pair of the bit lines; a connection switching circuit connected between the pair of bit lines and the pair of sense nodes, which connects electrically the pair of bit lines and the pair of sense nodes when a write control signal is in a prescribed logic level; and a timing control circuit which sets the write control signal to the prescribed logic level substantially at the same time as a timing when a column selection signal selects a column to which the memory cell to be written is connected during data writing period for the memory cells, and holds the write control signal to the prescribed logic level during a first period regulated by the timing when the column selection signal selects the columns.

14 Claims, 7 Drawing Sheets

SEMICONDUCTOR STORAGE APPARATUS

CROSS REFERENCE TO RELATED APPLICATIONS

This application is based upon and claims the benefit of priority from the prior Japanese Patent Application No. 2004-253059, filed on Aug. 31, 2004, the entire contents of which are incorporated herein by reference.

BACKGROUND OF THE INVENTION

1. Field of the Invention

The present invention relates to a semiconductor storage apparatus including cell arrays having a plurality of memory cells, and sense amplifiers.

2. Related Art

As for the conventional one transistor—one capacitor DRAM cell including a trench capacitor or a stacked capacitor, there is a concern that its fabrication may become difficult as it becomes finer. As a candidate for a future DRAM, a new memory cell FBC (Floating Body Cell) is proposed (see Japanese Patent Application Laid-Open Publication Nos. 2003-68877 and 2002-246571). In the FBC, majority carriers are stored in a floating body of an FET (Field Effect Transistor) formed on SOI (Silicon on Insulator) or the like, to store information.

In such a memory cell, an element unit for storing one bit information is formed of only one MISFET (Metal Insulator Semiconductor Field Effect Transistor). Therefore, the occupation area of one cell is small, and storage elements having a large capacity can be formed in a limited silicon area. It is considered that such a memory cell can contribute to an increase of the storage capacity.

The principle of writing and reading for an FBC can be described as follows by taking an N-type MISFET as an example. A state of "1" is defined as a state in which there are a larger number of holes. On the contrary, a state in which the number of holes is smaller is defined as "0."

The FBC includes an nFET formed on SOI. Its source is connected to GND (0 V) and its drain is connected to a bit line (BL), whereas its gate is connected to a word line (WL). Its body is electrically floating. For writing "1" into the FBC, the transistor is operated in the saturation state. For example, the word line WL is biased to 1.5 V and the bit line BL is biased to 1.5 V. In such a state, a large number of electron-hole pairs are generated near the drain by impact ionization. Among them, electrons are absorbed to the drain terminal. However, holes are stored in the body having a low potential. The body voltage arrives at a balanced state in which a current generating holes by impact ionization balances a forward current of a p-n junction between the body and the source. The body voltage is approximately 0.7 V.

A method of writing data "0" will now be described. For writing "0," the bit line BL is lowered to a negative voltage. For example, the bit line BL is lowered to −1.5 V. As a result of this operation, a p-region in the body and an n-region connected to the bit line BL are greatly forward-biased. Most of the holes stored in the body are emitted into the n-region. A resultant state in which the number of holes has decreased is the "0" state.

As for the data reading, distinguishing between "1" and "0" is conducted by setting the word line WL to, for example, 1.5 V and the bit line BL to a voltage as low as, for example, 0.2 V, operating the transistor in a linear region, and detecting a current difference by use of an effect (body effect) that a threshold voltage (Vth) of the transistor differs depending upon a difference in the number of holes stored in the body. The reason why the bit line voltage is set to a voltage as low as 0.2 V in this example at the time of reading is as follows: if the bit line voltage is made high and the transistor is biased to the saturation state, then there is a concern that data that should be read as "0" may be regarded as "1" because of impact ionization and "0" may not be detected correctly.

In order to read out data stored in the FBC, a sense amplifier for detecting a current difference between a "0" cell and a "1" cell is provided. The sense amplifier in the conventional FBC has a configuration in which one node is selected from plurality of bit lines BL and sense amplifiers are arranged for the selected nodes. The reason why such a configuration can be adopted is that nondestructive readout is supposed to be possible for the FBC. In other words, the FBC is thought to have a feature that data in cells that are not read are not destroyed even if the word line becomes active and the data continue to be retained as they are if the word line is restored to the retaining level.

In subsequent characteristic evaluation of the FBC, however, it has been found that the FBC is not necessarily a non-destructive read-out cell. Because it has been found that the charge pumping phenomenon affects the characteristics of the cell. If the gate of the transistor is pumped a plurality of times and thereby the inversion state and the accumulation state on the silicon surface are repeated alternately, holes gradually disappear at an interface between the silicon surface and $SiO_2$. This is the charge pumping phenomenon.

The number of holes that disappear due to one state change between inversion and accumulation depends on a density Nit of interface states the Si—$SiO_2$ interface. For example, supposing that Nit=$1 \times 10^{10}$ cm$^{-2}$ and W (channel width)/L (channel length) of a cell transistor=0.1 μm/0.1 μm, the area of the Si—$SiO_2$ interface becomes $1.0 \times 10^{-10}$ cm$^2$ per cell and consequently the number of interface states per cell becomes approximately one on the average. The number of holes stored in one FBC has a difference of approximately 1,000 depending upon whether the data is "1" or "0". If the word line WL is subjected to pumping approximately 1,000 times, therefore, data "1" completely changes to data "0". Practically, if the word line WL is subjected to pumping approximately 500 times, then the readout margin for the data "1" is lost and the risk that a fail may occur becomes high.

In this way, the FBC is neither a destructive read-out cell nor a complete non-destructive read-out cell. It is found that the FBC is so to speak a "quasi non-destructive read-out cell".

If the sense amplifier circuit of the conventional scheme is applied to such a case, data is not written back even when the word line is activated. If WL is activated during the refresh operation approximately 500 times, therefore, a fail in which data "1" changes to "0" occurs. Irrespective of whether the cell is selected for reading/writing, therefore, it becomes necessary to design a sense amplifier with some measure against the charge pumping phenomenon taken on all "1" data cells for which the word line WL is activated.

Furthermore, such a sense amplifier circuit has a problem of a poor efficiency in the refresh operation as well. In other words, the number of cells that can be refreshed in one refresh cycle decreases to one eighth as compared with an ordinary DRAM in the case where the sense amplifier is connected to a node which are selected from eight BLs. If the refresh time is equal, therefore, it is necessary to conduct the refresh operation as frequently as eight times. By that amount, the proportion in which the ordinary read/write operation cannot be conducted increases.

In addition, there is also a problem that the number of cells that can be accessed is limited when conducting fast column access. In other words, when using a sense amplifier circuit so as to increase the transfer rate of data by activating the word line, reading out cell data, latching the cell data in sense amplifiers, and accessing the data fast and continuously by means of only column address switching, the number of data that can be accessed decreases to one eighth as compared with the ordinary DRAM.

If time required for FBC writing is longer than the cycle time when writing data by using fast column access, then a write fail occurs and this results in a problem that the column access cycle time cannot be made shorter than the FBC write time. Especially, writing FBC data "1" means charging capacitance of the body with holes generated by the impact ionization. If the number of holes generated by the impact ionization is small, therefore, the write time may become as long as approximately several nanoseconds ($10^9$ second) or more in some cases.

SUMMARY OF THE INVENTION

A semiconductor storage apparatus according to one embodiment of the present invention, comprising:
a cell array including a plurality of memory cells connected to bit lines arranged in a column direction and word lines arranged in a row direction; and
a sense amplifier which controls read-out of data stored in the memory cells,
wherein the sense amplifier includes:
a pair of sense nodes provided corresponding to a pair of the bit lines;
a connection switching circuit which connects electrically the pair of bit lines and the pair of sense nodes when a write control signal is in a prescribed logic level; and
a timing control circuit which sets the write control signal at the prescribed logic level at the same time when a column selection signal selects a column, and then holds the write control signal at the prescribed logic level during a first period.

DETAILED DESCRIPTION OF THE INVENTION

Hereafter, an embodiment of the present invention will be described with reference to the drawings.

Figure 1:
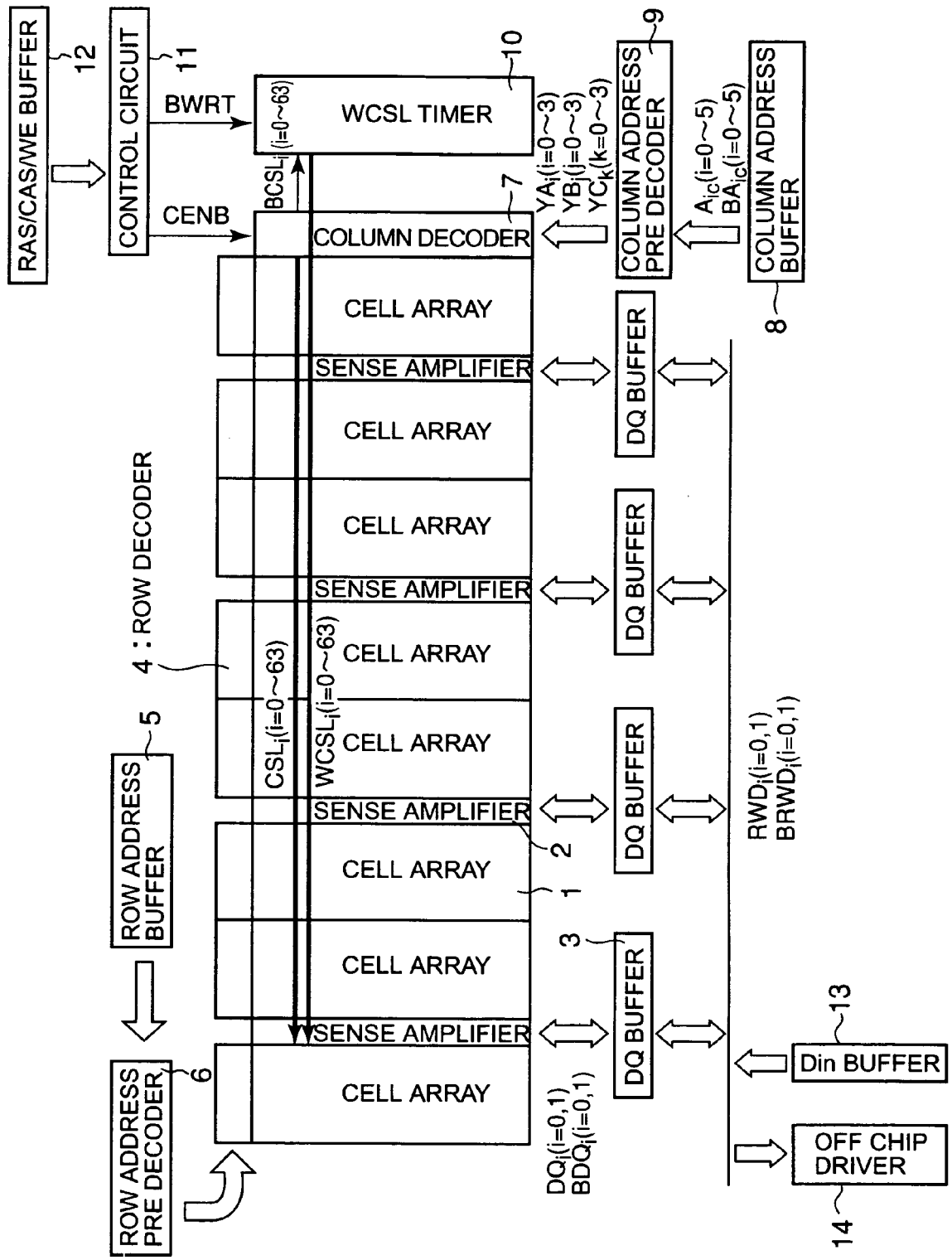
FIG. 1 is a block diagram showing a general configuration of a semiconductor storage apparatus according to an embodiment of the present invention.

FIG. 1 is a block diagram showing a general configuration of a semiconductor storage apparatus according to an embodiment of the present invention. The semiconductor storage apparatus shown in FIG. 1 includes a plurality of cell arrays 1 arranged in a row direction, sense amplifiers 2 disposed between these cell arrays 1, DQ buffers 3 for conducting input/output for data line, row decoders 4, a row address buffer 5, a row address pre-decoder 6, a column decoder 7, a column address buffer 8, a column address pre-decoder 9, a WCSL timer 10 described later, a control circuit 11, a RAS/CAS/WE buffer 12, a Din buffer 13, and an off-chip driver 14.

Figure 2:
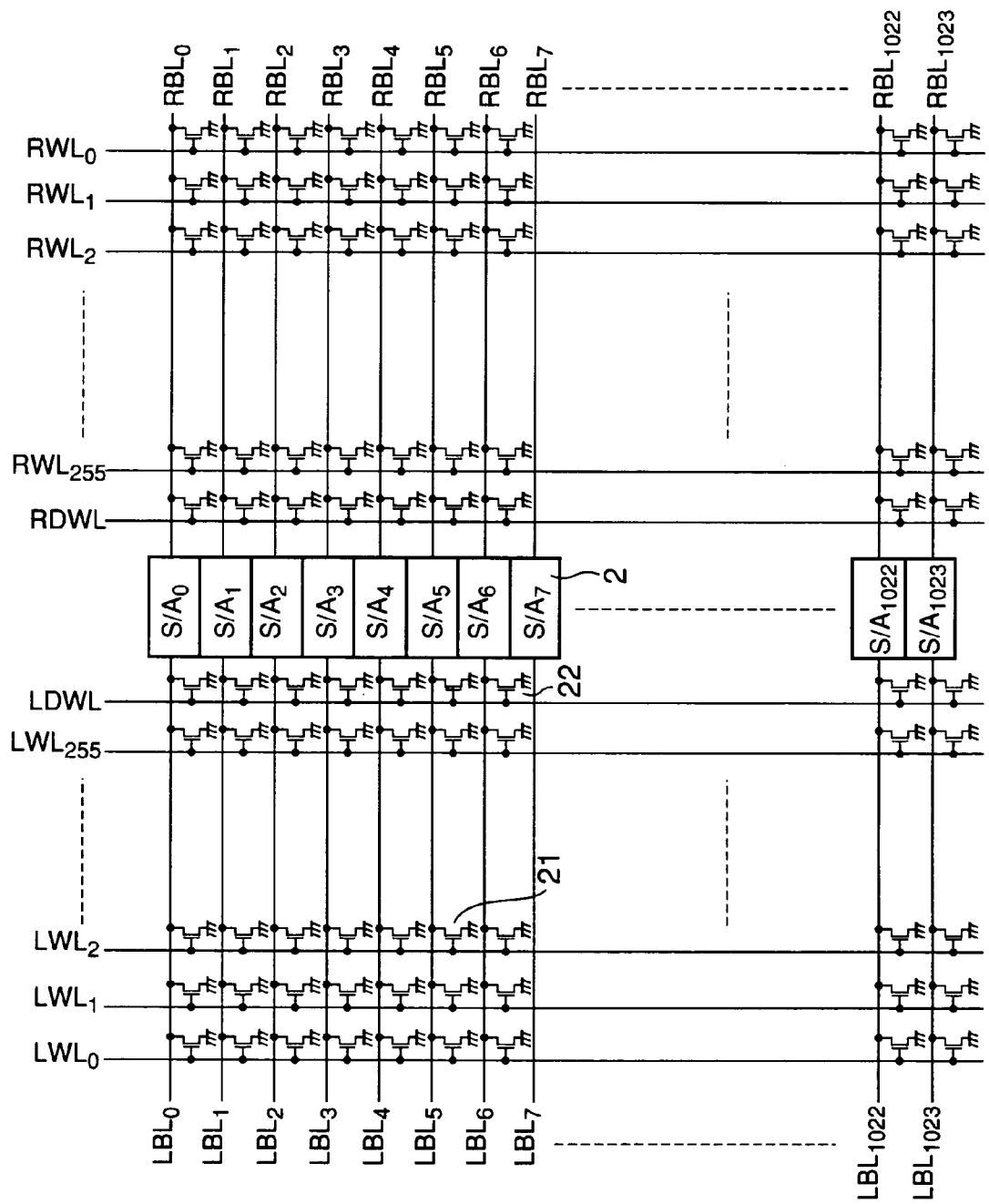
FIG. 2 is a circuit diagram showing an example of a detailed configuration of the cell array and the sense amplifiers.

FIG. 2 is a circuit diagram showing an example of a detailed configuration of the cell array 1 and the sense amplifiers 2 (S/A0 to S/A1023). As shown in FIG. 2, 256 word lines LWL0 to LWL255, a dummy word line LDWL, 256 word lines RWL0 to RWL255 and a dummy word line RDWL are arranged in a row direction on left and right sides of a plurality of sense amplifiers 2 arranged in the center, respectively. In a column direction, 1024 bit lines LBL0 to LBL1023 and 1024 bit lines RBL0 to RBL1023 are arranged on the left and right sides of the sense amplifiers 2. FBCs 21 are disposed near intersections of the word lines and the bit lines, respectively. Dummy cells 22 are disposed near intersections of the dummy word lines and the bit lines, respectively.

When conducting read out, one word line belonging to some cell array 1 selected by a row address A9R is activated (raised) and a dummy word line belonging to the cell array 1 located across the sense amplifiers 2 from the word line is activated (raised).

A reference level of "½" is written in the dummy cells 22, or "0" and "1" are alternately written into the dummy cells that are adjacent in the column direction. In the latter case, data in two adjacent dummy cells 22 are read out at the time of read operation and averaged to generate the reference level of "½". And data read out from the FBC 21 selected by a word line is compared with the reference level of "½" from the dummy cells 22. It is determined whether data stored in the FBC 21 is "0" or "1" depending upon whether a cell current flowing through the FBC 21 is larger or smaller than a current flowing through a dummy cell 22.

Figure 3:
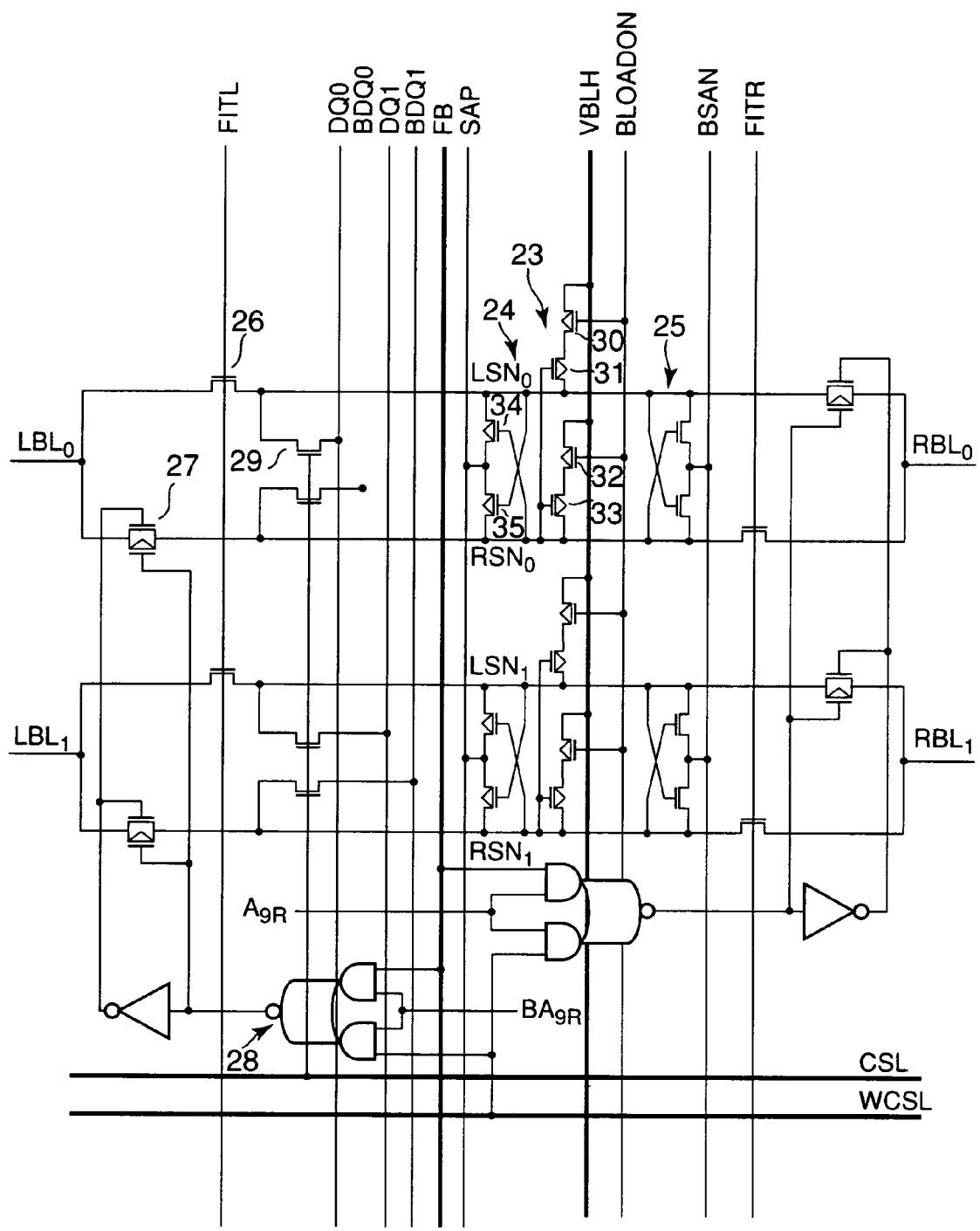
FIG. 3 is a circuit diagram showing an example of an internal configuration of a sense amplifier.

FIG. 3 is a circuit diagram showing an example of an internal configuration of a sense amplifier 2. The sense amplifier 2 is shared by the left and right bit lines. Hereafter, an internal configuration of the sense amplifier 2 will be described along a path connected to the bit lines LBL0 and RBL0.

As shown in FIG. 3, the sense amplifier 2 includes a pair of sense nodes LSN0 and RSN0 corresponding to the bit lines LBL0 and RBL0, a current load circuit 23 connected to the pair of the sense nodes LSN0 and RSN0, dynamic latch circuits 24 and 25 connected to the pair of the sense nodes LSN0 and RSN0, a read control transistor 26 for the FBC 21 or the dummy cell 22, a transfer gate 27 for controlling to write data into the FBC 21, a write control circuit 28 for controlling the transfer gate 27, and a transistor 29 for controlling data input and output.

The current load circuit 23 includes PMOS transistors 30 and 31 connected in series between a positive voltage VBLH and the sense node LSN0, and PMOS transistors 32 and 33 connected in series between the positive voltage VBLH and the sense node RSN0. The transistors 31 and 33 are short-circuited to each other at their gates to form a current mirror circuit. If a signal BLOADON becomes a low level, therefore, the current load circuit 23 lets currents of the same quantity flow through the pair of sense nodes LSN0 and RSN0.

Each of the dynamic latch circuits 24 and 25 includes PMOS transistors 34 and 35 cross-connected between the pair of sense nodes LSN0 and RSN0. If a potential difference between the pair of sense nodes LSN0 and RSN0 becomes large, and a signal SAP connected between the transistors 34 and 35 and a signal BSAN respectively become a high level and a low level, then the dynamic latch circuits 24 and 25 amplify a potential difference obtained between the pair of sense nodes LSN0 and RSN0.

If a signal FITL becomes a high level, the read control transistor 26 short-circuits the bit line LBL0 to the sense node LSN0. If a column selection signal CSL becomes a high level, the data input & output control transistor 29 short-circuits a data line DQ0 to the sense node LSN0, and short-circuits a data line BDQ0 to the sense node RSN0. A write control circuit 28 controls opening/closing of the transfer gate 27 based on logic levels of a write control signal WCSL, a row address BA9R and a write back signal FB.

Figure 4:
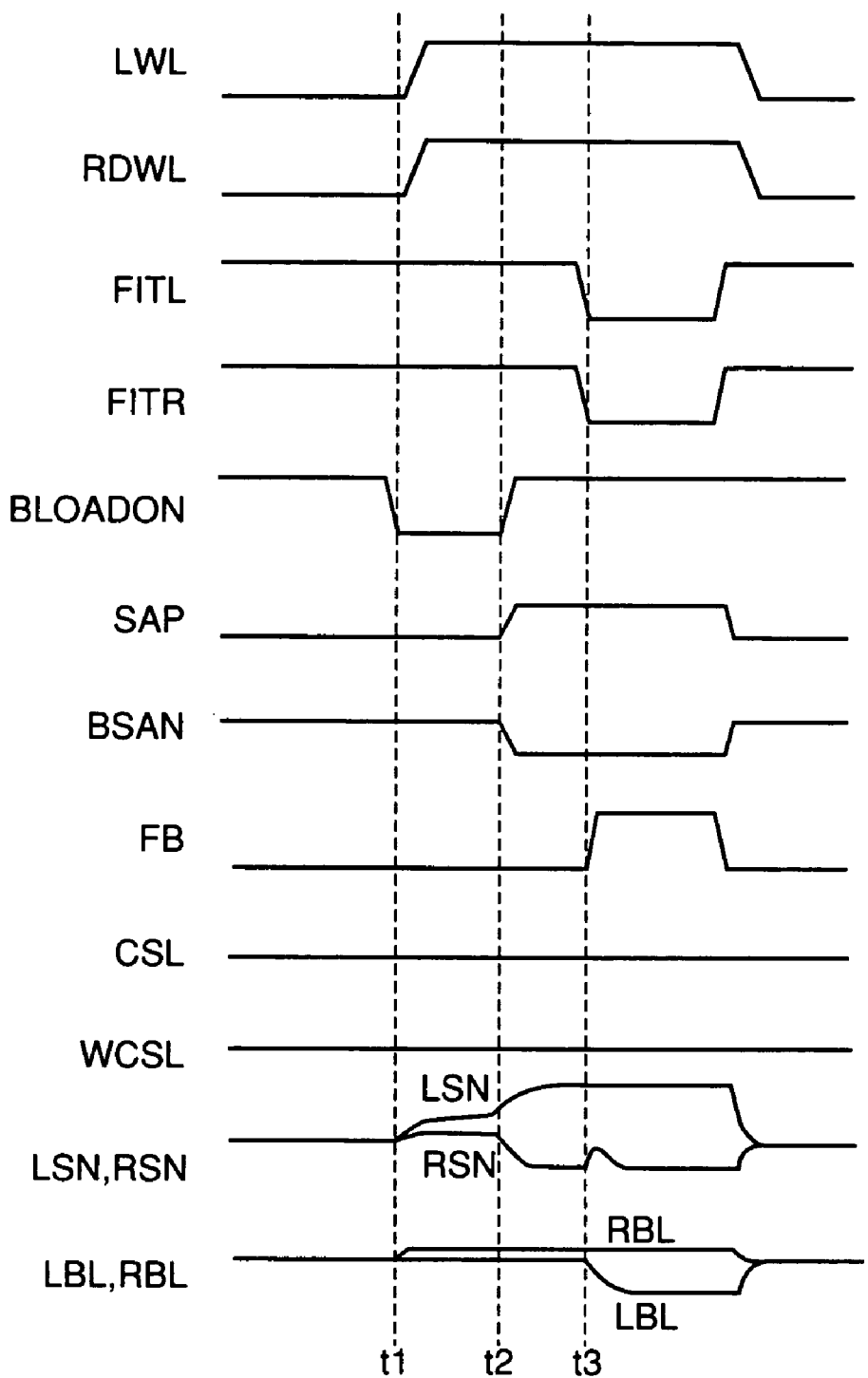
FIG. 4 is a timing chart at the time of refresh operation.

In the present embodiment, refresh operation is conducted periodically as a countermeasure against the charge pumping phenomenon. FIG. 4 shows a timing chart at the time of refresh operation. Hereafter, it is supposed that a FBC 21 connected to the bit line LBL0 is to be refreshed. At time t1, the signal FITL and a signal FITR are at a high level and data in the FBC 21 to be refreshed is read out. If the signal BLOADON becomes a low level at the time t1, the potential difference between the pair of sense nodes LSN0 and RSN0 shown in FIG. 3 gradually increases. At this time, the transistor 26 is in the on-state, and data stored in the FBC 21 to be refreshed is read out onto the sense node LSN0.

If the signal SAP becomes a high level and the signal BSAN becomes a low level, the dynamic latch circuits 24 and 25 latch the potentials at the pair of sense nodes LSN0 and RSN0.

Subsequently, if the signal FB becomes a high level at time t3, then the transfer gate 27 opens and the potential at the sense node RSN0 is written into the bit lines LBL0 and RBL0.

When conducting refreshing, the column selection line CSL remains at the low level and refresh operation is conducted on all columns specified by the row address A9R simultaneously in parallel.

Figure 5:
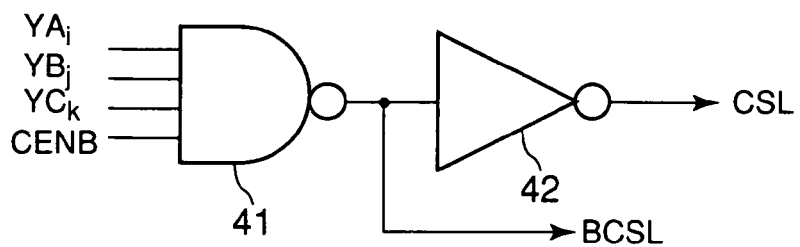
FIG. 5 is a circuit diagram showing an example of an internal configuration of the column decoder 7.

Writing data into an FBC 21 will now be described. FIG. 5 is a circuit diagram showing an example of an internal configuration of the column decoder 7. As shown in FIG. 5, the column decoder 7 includes a NAND circuit 41 for performing NAND computation on signals YAi (i=0 to 3), YBj (j=0 to 3) and YCk (k=0 to 3) generated by a pre-decoder, which is not illustrated, and an enable signal CENB, and an inverter 42 for inverting an output of the NAND circuit 41 and outputting the inverted output.

The pre-decoder, which is not illustrated, generates YAi (i=0 to 3), YBj (j=0 to 3) and YCk (k=0 to 3) on the basis of column address signals Aic (i=0 to 5) and their inverted signals BAjc (j=0 to 5). The output of the NAND circuit 41 is BCSL, and the output of the inverter 42 is the column selection signal CSL.

Figure 6:
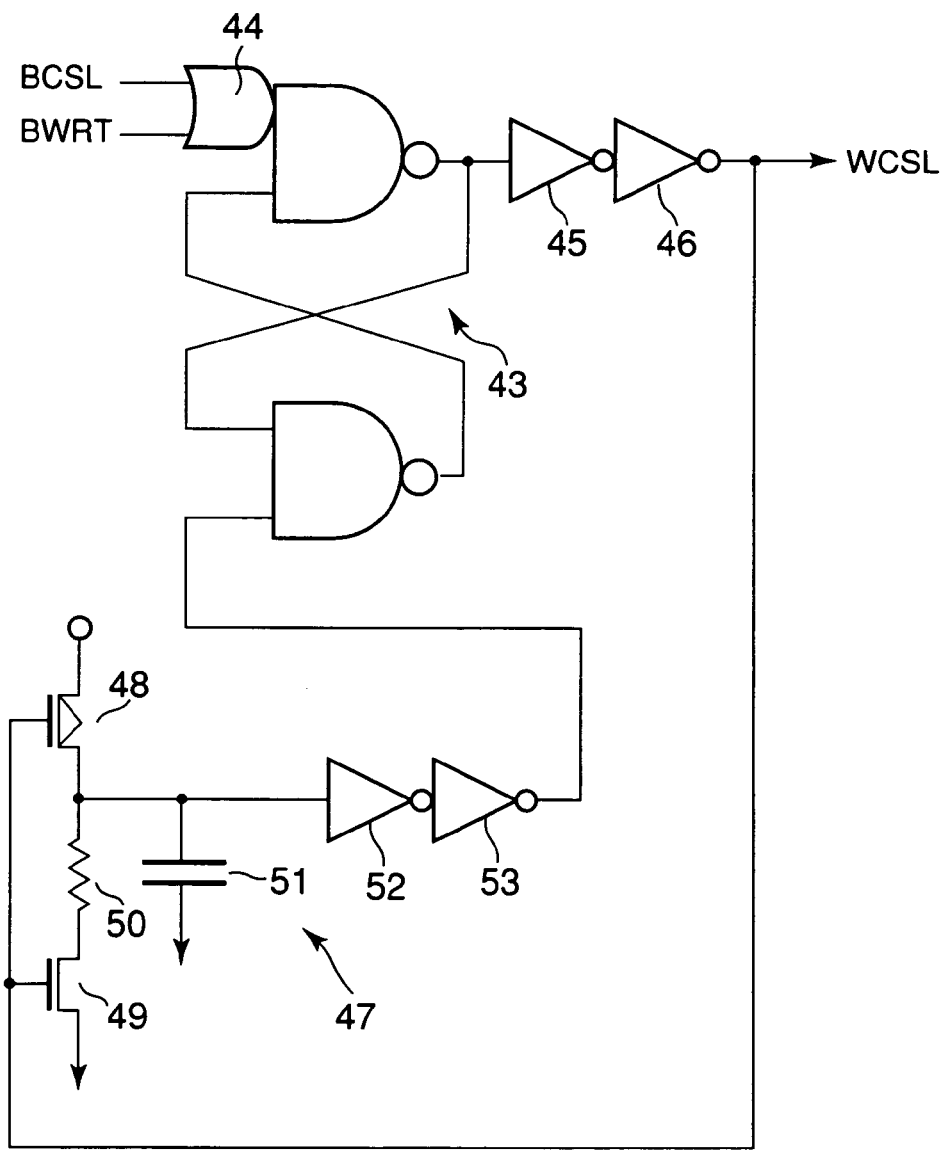
FIG. 6 is a circuit diagram showing an example of an internal configuration of the WCSL timer 10.

FIG. 6 is a circuit diagram showing an example of an internal configuration of the WCSL timer 10. The WCSL timer 10 includes a flip-flop 43 formed of two NAND circuits, an OR circuit 44 for controlling to bring the flip-flop 43 into a set state, inverters 45 and 46 connected in cascade to the output of the flip-flop 43, and a delay circuit 47 for exercising control so as to bring the flip-flop 43 into the reset state a predetermined time after an output WCSL of the inverter 46 has become its high level.

The delay circuit 47 includes a PMOS transistor 48 and an NMOS transistor 49 connected in series and turned on/off simultaneously by the output WCSL of the inverter 46, a resistor 50 connected between the PMOS transistor 48 and the NMOS transistor 49, a capacitor 51 connected between the PMOS transistor 48 at its drain and a ground voltage, and cascaded inverters 52 and 53 connected between the drain of the PMOS transistor 48 and a reset terminal of the flip-flop 43.

Hereafter, operation of the WCSL timer shown in FIG. 6 will be described. If the column selection signal becomes a high level during writing (BWRT is set low), then the signal BCSL becomes a low level and an output of the OR circuit 44 becomes a low level. As a result, the flip-flop 43 is set to a high level, and the write control signal WCSL becomes a high level. The capacitor 51 in the delay circuit 47 begins to discharge via the NMOS transistor 49. Until charges in the capacitor 51 are fully discharged, the reset terminal of the flip-flop 43 does not become a low level. Even if the column selection signal becomes a low level, therefore, the write control signal WCSL maintains its high level for a while.

The discharge time of the capacitor 51 is determined by a time constant, which depends on a resistance value of the resistor 50 and capacitance of the capacitance 51. In the present embodiment, the time constant is determined so as to make an interval over which the write control signal WCSL is active (the high level) longer than an interval over which the column selection signal CSL is active. Specifically, the time constant is set so as to make it possible for the write control signal WCSL to maintain the high level as long as the time necessary to write data into a cell.

The timer 10 in which charges stored in the capacitor 51 are discharged through the resistor 50 to prescribe the time as shown in FIG. 6 is not affected by a change in power supply voltage, a temperature change and characteristics dispersion of elements such as transistors. Thus, accurate and stable time can be set.

If the capacitor 51 is fully discharged after the column selection signal CSL has become the low level, then the output of the inverter 53 becomes the low level and consequently the flip-flop 43 is brought into the reset state and the write control signal WCSL becomes a low level.

Figure 7:
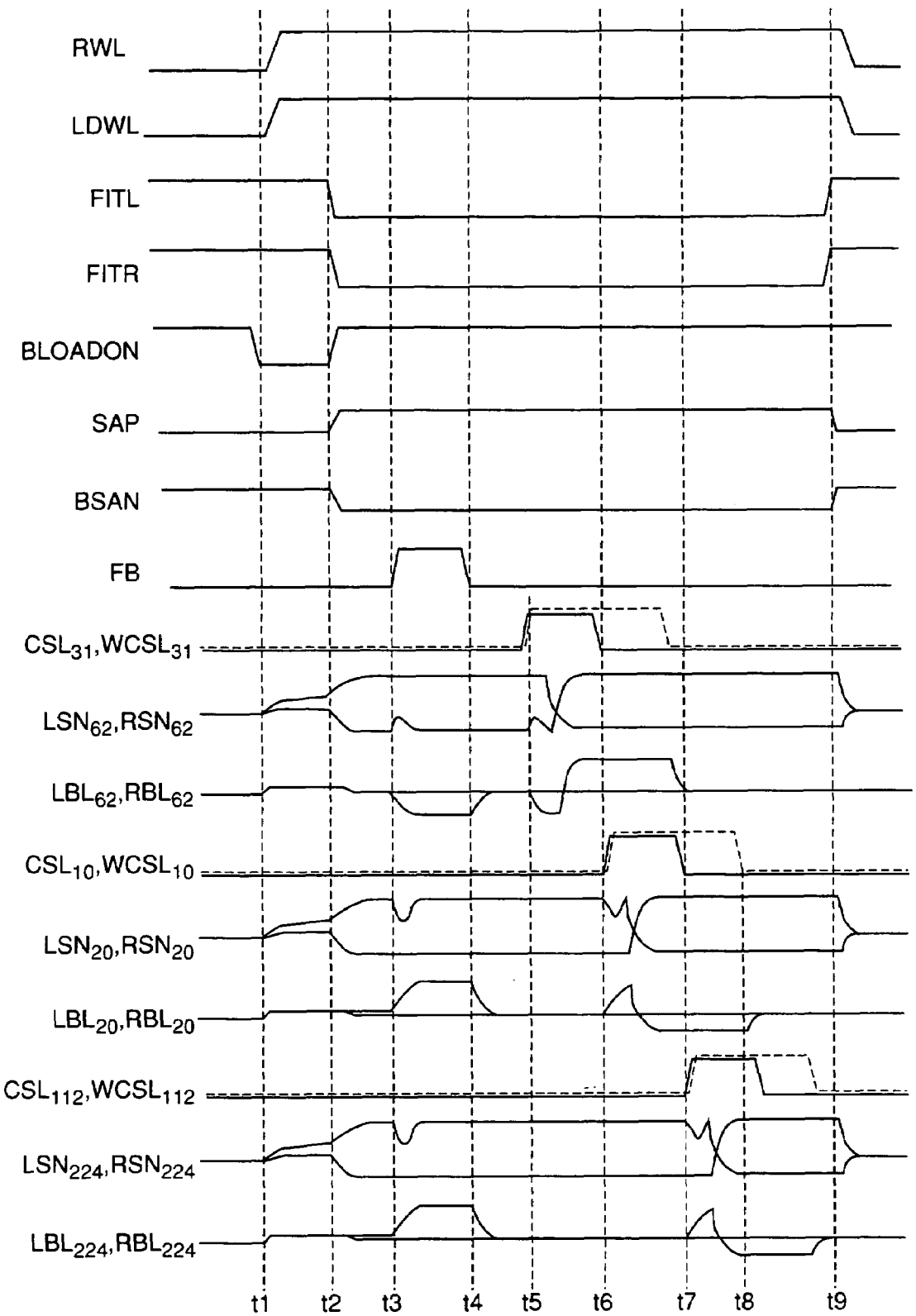
FIG. 7 is a timing diagram at the time when data is written into an FBC 21.

FIG. 7 is a timing diagram at the time when data is written into an FBC 21. In an example shown in this timing diagram, refresh operation for supplying holes vanished by the charge pumping phenomenon is first conducted, and then 31st, 10th and 112th column selection lines are consecutively activated in order to write data amplified by sense amplifiers 2.

A time period ranging from time t1 to t4 is an interval for the refresh operation. In this interval, operation similar to that shown in FIG. 4 is conducted, and data read out from an FBC 21 is written back to the FBC 21 beginning at time t3 when a signal FB has become a high level. The signal FB rises only once at the time of first refresh, and thereafter the signal FB becomes inactive (a low level).

Thereafter, data write operation is conducted after time t5. Specifically, writing is conducted for the 31st column in an interval ranging from time t5 to t7, for the 10th column in an interval ranging from time t6 to t8, and for the 112th column in an interval ranging from time t7 to t9.

As for data writing, only a transfer gate 27 corresponding to the activated (selected) column selection line CSL is opened and data are written into FBCs 21 in respective write cycles in order.

Since transfer gates 27 corresponding to unselected columns are closed, corresponding bit lines are in the floating state and cell currents do not flow through the corresponding bit lines. As a result, power consumption can be reduced.

The write control signal WCSL generated by the WCSL timer 10 shown in FIG. 6 rises at the same timing as the column selection line CSL does. If it takes a longer time to write data in an FBC 21 than the selection interval for the column selection line CSL, therefore, the write control signal WCSL falls after the column selection line CSL has become unselected (the low level).

If the selection interval for the column selection line CSL is longer than the time set in the WCSL timer 10, the flip-flop 43 maintains its set state as long as the column selection line CSL is at the high level. When the column selection line CSL has become unselected, therefore, the flip-flop 43 is brought into its reset state and the write control signal WCSL becomes the low level at substantially the same timing as that of the column selection line CSL. Practically, as apparent from the circuit of FIG. 6, after the column selection line CSL becomes low level (i.e. the signal BCSL becomes high level), and the signal passes through the gate 44, the flipflop 43 and the inverters 45 and 46, the write control signal WCSL becomes low level.

Figure 8:
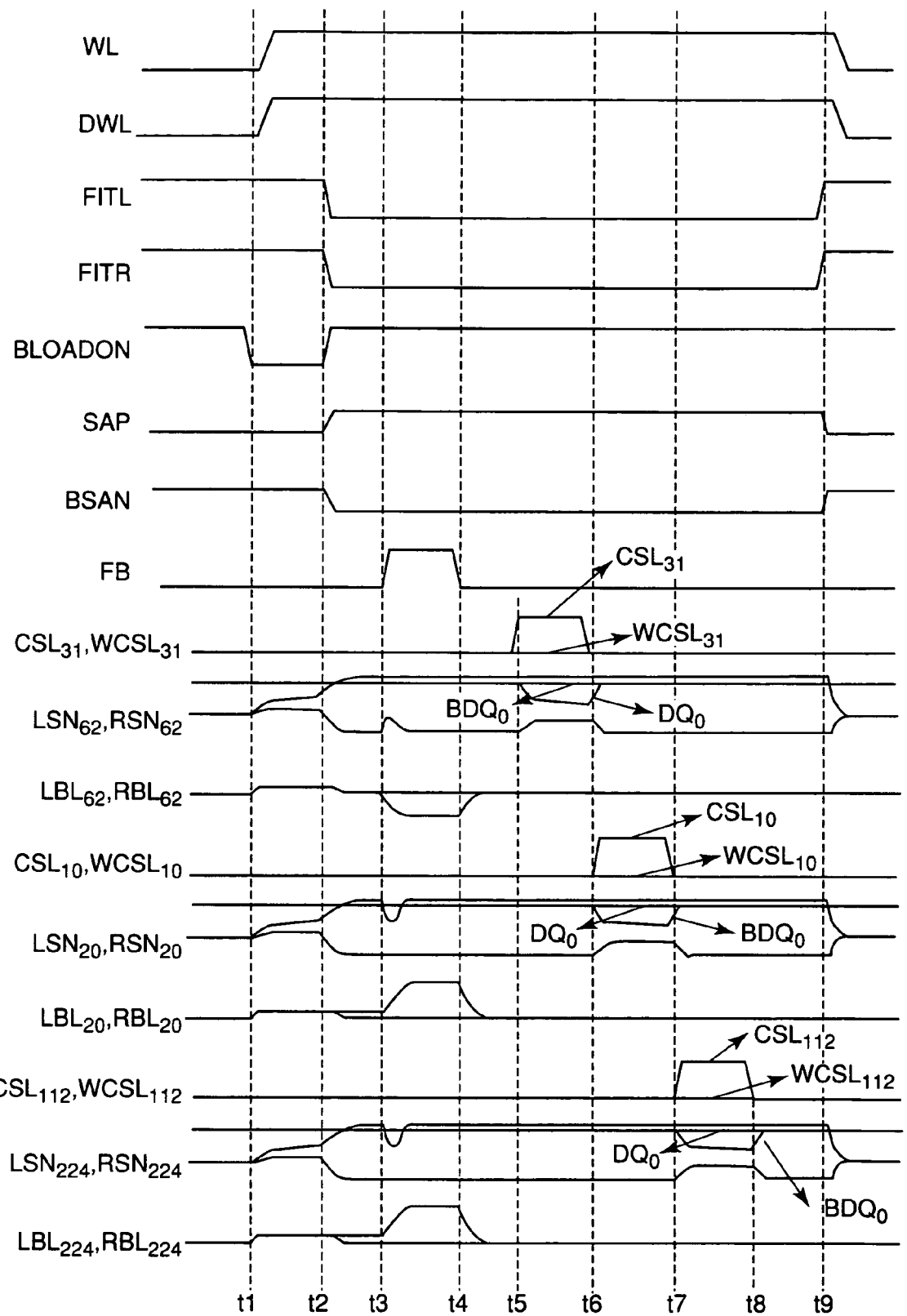
FIG. 8 is a timing diagram showing data reading from an FBC 21.

FIG. 8 is a timing diagram showing data reading from an FBC 21. In the case shown in FIG. 8 as well, refresh operation for supplying holes vanished by the charge pumping phenomenon is first conducted (time t1 to t4). After time t5, 31st, 10th and 112th column selection lines CSL are consecutively activated and data amplified by sense amplifiers 2 are read out onto data lines DQ and BDQ. Specifically, readout is conducted for the 31st column in an interval ranging from time t5 to t6, for the 10th column in an interval ranging from time t6 to t7, and for the 112th column in an interval ranging from time t7 to t8.

In the readout, only the column selection line rises, and the write control signal WCSL remains inactive (the low level). Therefore, data latched between a pair of sense nodes LSN and RSN is not written back to the cell side.

Thus, if the selection interval for the column selection line CSL is shorter than the time taken to write data into an FBC 21, then in the present embodiment the write control signal WCSL is maintained in the active state (the high level) for a predetermined time even after the column selection line CSL has become unselected. Even if it takes a longer time to write data in the FBC 21 than the CSL activation period, therefore, it is possible to write data into the FBC 21 normally. In addition, since the refresh operation for the FBC 21 is conducted before writing/reading data into/from the FBC 21 in order to cope with the charge pumping phenomenon in the FBC 21, it is possible to certainly prevent the charge pumping phenomenon from destroying data in the FBC 21.

In the embodiment, an example in which the column selection lines CSL and the write control signals WCSL are provided respectively by taking a pair of sense nodes and a pair of bit lines as the unit has been described. The unit of sense nodes and bit lines controlled by one selection line CSL and the unit of sense nodes and bit lines controlled by one write control signal WCSL may be changed. For example, the column selection lines CSL may be provided by taking a pair of sense nodes and a pair of bit lines as the unit, and the write control signals WCSL may be provided by taking an integer times as many as the pair of sense nodes and the pair of bit lines as the unit.

If the number of sense nodes and bit lines controlled by one write control signal WCSL is thus increased, then the number of the write control signals WCSL can be decreased accordingly and the chip area can be reduced. Since the current consumption flowing through the write control signal WCSL increases accordingly, however, it is desirable to set the control range of the write control signal WCSL by taking the tradeoff between the increase of the chip area and the increase of the power consumption into consideration.

What is claimed is:

1. A semiconductor storage apparatus, comprising:
   a cell array including a plurality of memory cells connected to bit lines arranged in a column direction and word lines arranged in a row direction; and
   a sense amplifier which controls read-out of data stored in the memory cells,
   wherein the sense amplifier includes:
   a pair of sense nodes provided corresponding to a pair of the bit lines;
   a connection switching circuit which connects electrically the pair of bit lines and the pair of sense nodes when a write control signal is in a prescribed logic level; and
   a timing control circuit which sets the write control signal at the prescribed logic level at the same time when a column selection signal selects a column, and then holds the write control signal at the prescribed logic level during a first period.

2. The semiconductor storage apparatus according to claim 1, wherein the first period is a period longer than a minimum time required for writing data to the memory cells.

3. The semiconductor storage apparatus according to claim 2, wherein the timing control circuit holds the write control signal at the prescribed logic level for the first period longer than a second period in which the column selection signal selects a column, when the second period is shorter than the minimum time.

4. The semiconductor storage apparatus according to claim 2, wherein the timing control circuit holds the write control signal at the prescribed logic level for the second period, when the period selected by the column selection signal is longer than the minimun time.

5. The semiconductor storage apparatus according to claim 1, wherein the timing control circuit is provided for each column.

6. The semiconductor storage according to claim 5, wherein the timing control circuit includes a flipflop which generates a signal set to a first logic level by the column selection signal and then set to a second logic level after the first period; and
   the write control signal is generated based on an output signal of the flip-flop.

7. The semiconductor storage apparatus according to claim 6, wherein the timing control circuit includes:
   two transistors connected in series, which turn on or off in accordance with the output signal of the flip-flop;
   an impedance element connected between the two transistors; and
   a capacitor element which discharges electric charge via one of the two transistors and the impedance element,
   wherein the flipflop is set to the second logic level after the first period fixed by a time constant between impedance of the impedance element and capacitance of the capacitor element.

8. The semiconductor storage apparatus according to claim 7, wherein a plurality of the cell arrays and the associated sense amplifiers are provided;

the flipflop, the two transistors, the impedance element and the capacitors element are shared with all the cell arrays and the associated sense amplifiers.

9. The semiconductor storage apparatus according to claim 7, wherein the two transistors have conduction types different from each other;

one of the two transistors turns on, and the other turns off, based on a logic level of the output signal of the flipflop; and the capacitor element switches charge or discharge in accordance with turning on or off of the two transistors.

10. The semiconductor storage apparatus according to claim 1, wherein the connection switching circuit cuts off a path between the pair of bit lines and the pair of sense nodes when data is read out from the memory cells.

11. The semiconductor storage apparatus according to claim 1, further comprising a refresh control circuit which reads out and rewrites data of the memory cells before writing data into the memory cells.

12. The semiconductor storage apparatus according to claim 11, wherein the refresh control circuit includes:

a dynamic latch circuit which latches a potential of the pair of sense nodes when a potential difference between the pair of sense nodes reaches a prescribed value; and an output control circuit which outputs data latched by the dynamic latch circuit at a prescribed timing and feedbacks the data to the pair of bit lines to rewrite the data to the read-out memory cell.

13. The semiconductor storage apparatus according to claim 1, wherein the sense amplifier is disposed between neighboring two cell arrays.

14. The semiconductor storage apparatus according to claim 1, wherein the memory cell is an FBC (Floating Body Cell).

* * * * *